(12) United States Patent
Collins et al.

(10) Patent No.: US 10,533,321 B1
(45) Date of Patent: Jan. 14, 2020

(54) MODULAR ENCLOSURES FOR TEMPERATURE-SENSITIVE COMPONENTS

(71) Applicant: Solarcraft, Inc., Sugar Land, TX (US)

(72) Inventors: Robert Francis Collins, Sugar Land, TX (US); Victor Francis Gingles, Sugar Land, TX (US)

( * ) Notice: Subject to any disclaimer, the term of this patent is extended or adjusted under 35 U.S.C. 154(b) by 0 days.

(21) Appl. No.: 15/587,106

(22) Filed: May 4, 2017

(51) Int. Cl.
| | |
|---|---|
| *E04C 2/38* | (2006.01) |
| *E04B 2/00* | (2006.01) |
| *H05K 7/14* | (2006.01) |
| *E04C 2/00* | (2006.01) |
| *H05K 7/20* | (2006.01) |
| *E04B 2/72* | (2006.01) |
| *E04C 2/284* | (2006.01) |

(52) U.S. Cl.
CPC ............... *E04C 2/38* (2013.01); *E04B 2/721* (2013.01); *E04C 2/284* (2013.01); *E04C 2/46* (2013.01); *H05K 7/14* (2013.01); *H05K 7/2039* (2013.01); *E04C 2002/004* (2013.01)

(58) Field of Classification Search
CPC ... E04C 2/38; E04C 2/284; E04C 2/46; E04C 2002/004; H05K 7/2039; H05K 7/14; E04B 2/721
USPC .......................................................... 361/807
See application file for complete search history.

(56) References Cited

U.S. PATENT DOCUMENTS

| | | | | |
|---|---|---|---|---|
| 4,567,698 A * | 2/1986 | Morrison | ............. | A47B 83/001 160/135 |
| 4,827,375 A * | 5/1989 | Segal | ....................... | H05K 7/14 361/693 |
| 4,891,920 A * | 1/1990 | Pingston | ............... | E04B 2/7409 181/287 |
| 5,233,803 A * | 8/1993 | Bockmiller | ........... | E04B 2/7401 52/239 |
| 5,398,510 A * | 3/1995 | Gilley | ..................... | F25B 21/02 62/3.6 |
| 5,938,302 A * | 8/1999 | Anderson | ............ | A47B 96/145 312/198 |
| 6,253,516 B1 * | 7/2001 | D'Andrea | ............. | E04B 2/7854 52/220.7 |
| 7,406,834 B2 * | 8/2008 | Williams | ........... | B60H 1/00364 62/115 |
| 8,065,846 B2 * | 11/2011 | McDonald | .............. | E04C 2/384 52/262 |
| 8,327,593 B2 * | 12/2012 | Laprise | ..................... | E04B 1/14 52/284 |
| 8,787,023 B2 * | 7/2014 | Lewis, II | .................. | H05K 7/18 361/724 |
| 2005/0053429 A1 * | 3/2005 | Davidsaver | ............... | E02B 3/06 405/284 |
| 2013/0192141 A1 * | 8/2013 | Kopish | ................. | E05D 15/063 49/413 |
| 2013/0301221 A1 * | 11/2013 | Wu | ......................... | H01L 23/38 361/707 |
| 2014/0054025 A1 * | 2/2014 | DeCarr | ............. | H05K 7/20945 165/287 |

(Continued)

*Primary Examiner* — Rockshanda D Chowdhury
(74) *Attorney, Agent, or Firm* — Elliott & Polasek, PLLC; Douglas H. Elliott; Nathan Q. Huynh

(57) ABSTRACT

Disclosed herein are modular enclosures for temperature-sensitive components that include a modular wall section some of which include a vertical support panel, a vertical strut channel connected to the vertical support panel, and a temperature-sensitive component connected to the vertical strut channel.

25 Claims, 10 Drawing Sheets

(56) References Cited

U.S. PATENT DOCUMENTS

2014/0196394 A1\* 7/2014 Greeson ............... H05K 7/1497
 52/404.2
2016/0100494 A1\* 4/2016 Novysedlak ......... H05K 1/0212
 361/748

\* cited by examiner

MODULAR ENCLOSURES FOR TEMPERATURE-SENSITIVE COMPONENTS

BACKGROUND

1. Field of Inventions

The field of this application and any resulting patent relates to modular enclosures.

2. Description of Related Art

Various methods and structures have been proposed and utilized for enclosures for temperature-sensitive components, including some of the methods and structures disclosed in the references appearing on the face of this patent. However, those methods and structures lack the combination of steps and/or features of the methods and/or structures covered by the patent claims below. Furthermore, it is contemplated that the methods and/or structures covered by at least some of the claims of this issued patent solve many of the problems that prior art methods and structures have failed to solve. Also, the methods and/or structures covered by at least some of the claims of this patent have benefits that would be surprising and unexpected to a hypothetical person of ordinary skill with knowledge of the prior art existing as of the filing date of this application.

For example, there is an ongoing need for improvements to enclosures, such as buildings and rooms, containing temperature-sensitive components that require environmental protection such as SCADA systems, RTU's, control panels, flow computers, gas chromatographs, storage batteries, computers and servers, radio transmitters and receivers, generators, compressors, and pumps. There is a need, for example, for a room to be easily assembled, e.g., by using modular walls, and for those temperature-sensitive components to be easily installed on the inside walls of the room immediately after the room is assembled without having to modify the walls once the components are identified. In many cases in the past, rooms designed to contain sensitive components were constructed in stages. In one of the early stages of construction, the walls themselves were first built or assembled, resulting in the construction of the skeleton of the room. Then at some later stage, the electronic components were installed, i.e., added to the walls. But in many cases the workers who built the walls were different from the workers who installed the components, with little coordination between the two groups of workers. Also, while the construction of the walls themselves may have been straightforward, involving structures and dimensions printed on blueprints, the nature and identity of the components, as well as their location and orientation on the walls, were not always straightforward. Sometimes the components, or where they were to be placed, changed after the blueprints were prepared. To accommodate for those changes, an intermediate stage existed between the wall construction stage and the component installation stage. During that intermediate stage, modifications were made to the inside walls including the placement of a variety of structures to support the components. Such a multi-stage assembly procedure has proven itself to be inefficient and time-consuming. The methods and structures below are designed to meet the need to provide a more efficient and less time-consuming construction procedure, and to overcome and solve other prior construction problems experienced by buildings used to house temperature-sensitive components.

Thermal conduction is a long-standing problem for prior enclosures that contain temperature-sensitive components. Accordingly, a long-felt need has existed for enclosures having adequate overall thermal resistance. In the past others have failed to achieve sufficiently high overall thermal resistance for modular enclosures. The requirement for, and the preponderance of, metal construction in prior enclosures has promoted thermal conduction and aggravated temperature control. Placing insulation in the space between wall panels has not solved the problem because metal components, e.g. studs, have in the past been typically used to connect inside and outside wall surfaces. That is, once an enclosure has been made by assembling walls connected using metal studs, any heat on one side of the enclosure has tended to be transferred through those metal components via conduction. This transfer of heat is sometimes referred to as a thermal short-circuit. Accordingly, with prior enclosures, the thermal resistance of the overall building has been substantially lower than that of the insulating material used within the walls. Enclosures constructed with industry standard "R-13" insulation, for example, with heavy metal studs, may have had overall resistance values as low as "R-2" or less, which has caused serious problems where temperature-sensitive components were placed inside those enclosures. In contrast, the methods and structures below are designed to meet the need for high overall heat (thermal) resistance for a modular enclosure designed to contain temperature-sensitive components, solve the long-standing problem of substantial heat conduction, and meet other long-felt needs described above and elsewhere herein.

SUMMARY

Certain specific embodiments disclosed herein include a modular enclosure for temperature-sensitive components that includes a modular wall section that includes a vertical support panel, a vertical strut channel connected to the vertical support panel, and a temperature-sensitive component connected to the vertical strut channel.

Certain specific embodiments disclosed herein include a modular enclosure for temperature-sensitive components comprising a first modular wall section; a second modular wall section; a vertical strut channel; and a temperature-sensitive component, wherein the first and second modular wall sections are connected to form a vertical alcove between the first and second modular wall sections; the vertical strut channel is disposed in the vertical alcove, and the temperature-sensitive component is connected to the vertical strut channel.

Certain specific embodiments disclosed herein include a modular enclosure for temperature-sensitive components that has an outer portion and an inner portion, and further includes a first inner wall, a first inner support panel, a second inner wall, a second inner support panel; a first outer wall, a first outer support panel, a second outer wall, a second outer support panel, a temperature-sensitive component and a core section, wherein: the first inner support panel is integral with the first inner wall or is adjacent to and connected to the first inner wall; the second inner support panel is integral with the second inner wall or is adjacent to and connected to the second inner wall; an inner connecting member connects the first inner support panel to the second inner support panel to form an inner alcove; the first outer support panel is integral with the first outer wall or is adjacent to and connected to the first outer wall; the second outer support panel is integral with the second outer wall or is adjacent to and connected to the second outer wall; an outer connecting member connects the first outer support panel to the second outer support panel to form an outer alcove; the core section is disposed between the first and second alcoves; an inner strut channel is disposed within the inner alcove; an outer strut channel is disposed within the outer alcove; and a transverse member extends through the core section to connect the inner strut channel to the outer strut channel; and the temperature-sensitive component is connected to the inner strut channel.

BRIEF DESCRIPTION OF. THE DRAWINGS

DETAILED DESCRIPTION

1. Introduction

Figure 1:
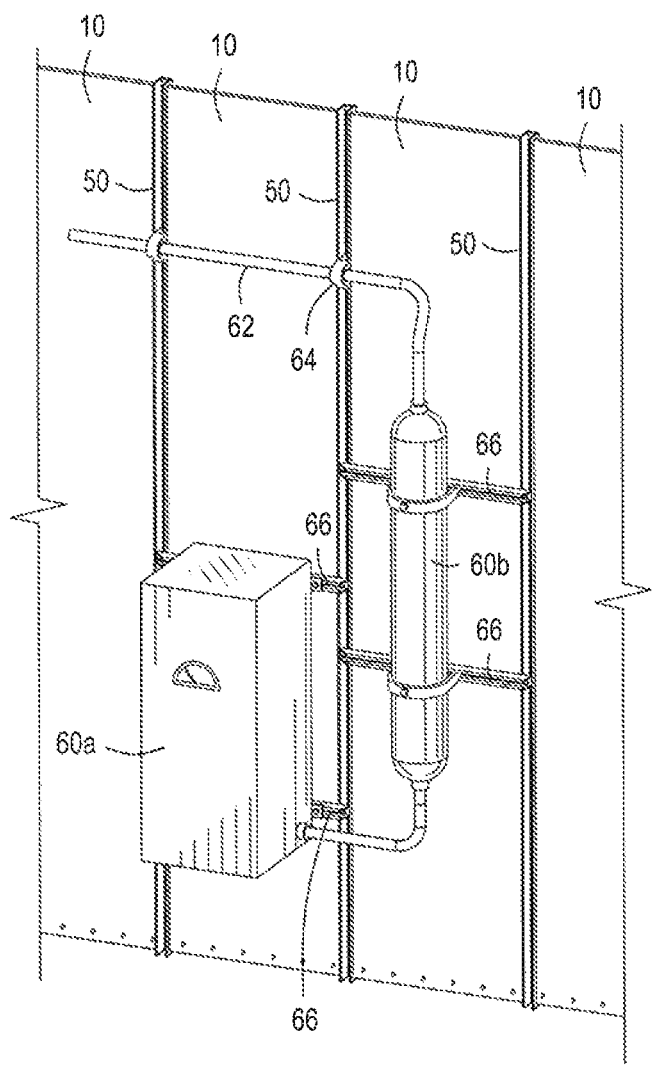
FIG. 1 depicts a modular wall with electronic components affixed thereto.

A detailed description will now be provided. The purpose of this detailed description, which includes the drawings, is to satisfy the statutory requirements of 35 U.S.C. § 112. For example, the detailed description includes a description of the inventions and sufficient information that would enable a person having ordinary skill in the art to make and use the inventions defined by the claims. In the figures, like elements are generally indicated by like reference numerals regardless of the view or figure in which the elements appear. The figures are intended to assist the description and to provide a visual representation of certain aspects of the subject matter described herein. The figures are not all necessarily drawn to scale, nor do they show all the structural details of the systems, nor do they limit the scope of the claims.

Each of the appended claims defines a separate invention which, for infringement purposes, is recognized as including equivalents of the various elements or limitations specified in the claims. Depending on the context, all references below to the "invention" may in some cases refer to certain specific embodiments only. In other cases, it will be recognized that references to the "invention" will refer to the subject matter recited in one or more, but not necessarily all, of the claims. Each of the inventions will now be described in greater detail below, including specific embodiments, versions, and examples, hut the inventions are not limited to these specific embodiments, versions, or examples, which are included to enable a person having ordinary skill in the art to make and use the inventions when the information in this patent is combined with available information and technology. Various terms as used herein are defined below, and the definitions should be adopted when construing the claims that include those terms, except to the extent a different meaning is given within the specification or in express representations to the Patent and Trademark Office (PTO). To the extent a term used in a claim is not defined below or in representations to the PTO, it should be given the broadest definition persons having skill in the art have given that term as reflected in at least one printed publication, dictionary, or issued patent.

2. Selected Definitions

Certain claims include one or more of the following terms which, as used herein, are expressly defined below.

The term "component" refers to any apparatus or device that is or can be connected, e.g., affixed or attached, to some surface, e.g., a wall of an enclosure, preferably a component through which fluids such as gas or liquids can flow, or components through which electrical signals flow. Examples of components are the temperature-sensitive components discussed below.

The term "temperature-sensitive component" refers to any component whose functionality, effectiveness, or performance can be hindered or affected negatively by a change in temperature. Examples of temperature-sensitive components are SCADA systems, RTU's, control panels, flow computers, gas chromatographs, storage batteries, computers and servers, radio transmitters and receivers, generators, compressors, and pumps.

The term "electronic" as used herein refers to any device that receives and/or transmits electricity, or that has one or more components that operate based on electricity.

The term "power system" as used herein means any system, device, apparatus or structure that is capable of generating energy, e.g., electricity.

The term "modular" as used herein describes any object or structure, such as a wall section or corner section, or panel, that can be assembled into a larger object or structure, such as a wall or room or building; and also refers to any larger object or structure, such as a wall or room or building, that is an assembly of other smaller objects or structures, such as wall section's or corner sections or panels. Thus, for example, a modular building is constructed of modular walls; and a modular wall is constructed or modular wall sections.

The term "wall" as used herein means any three dimensional structure having at least one substantially planar surface that is or can be oriented vertically, can be part of a room or building, and is preferably rectangular with a height and width each greater than its thickness. Preferably a wall forms part of a larger structure such as a room or building. Preferably, a wall includes wall panels or wall sections as exemplified herein. The walls disclosed herein are preferably modular.

Figure 2:
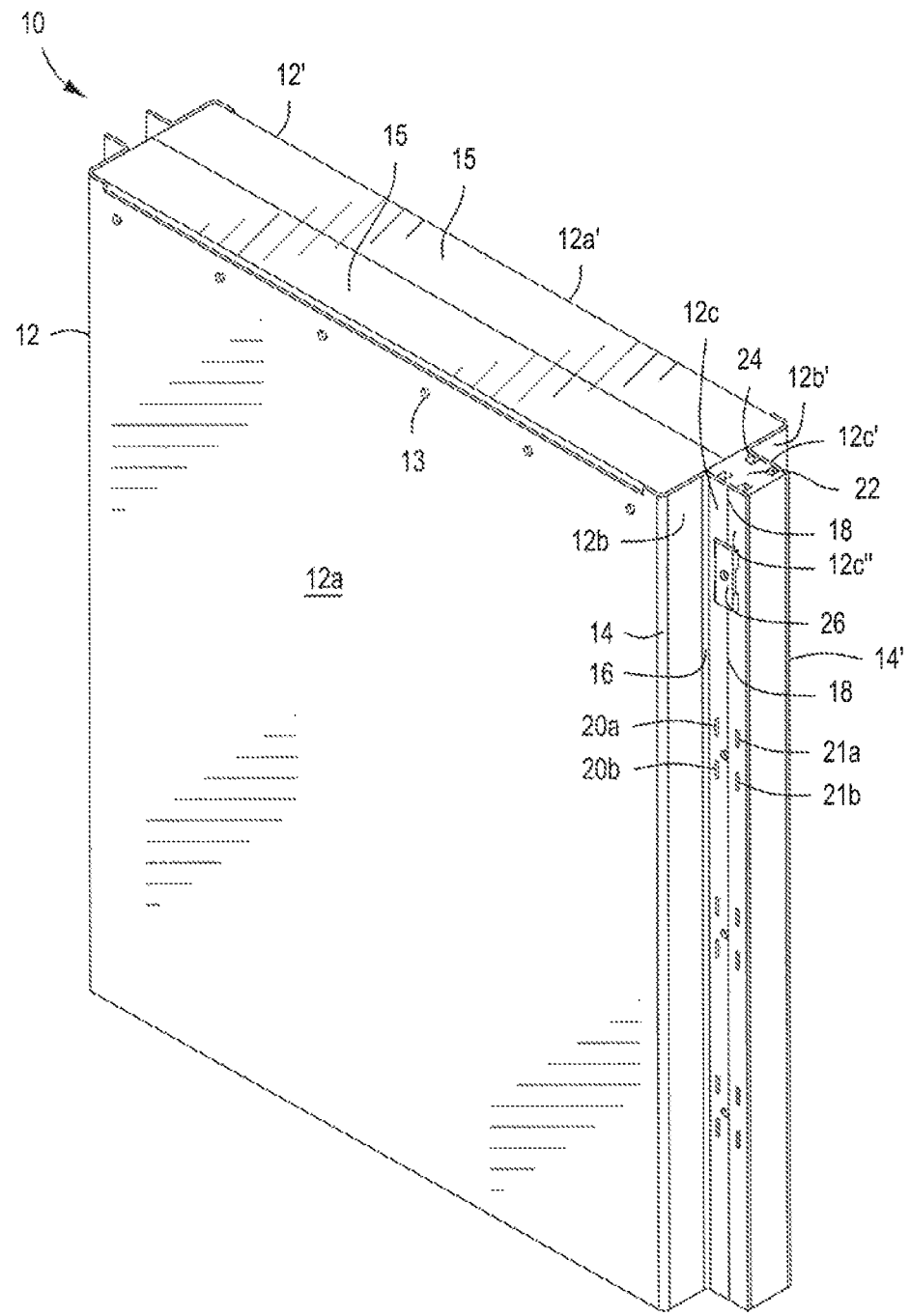
FIG. 2 shows a portion of a modular wall.

The term "panel" as used herein means any portion of a wall or wall section with at least one flat surface. For example, as depicted in FIG. 2, an inside wall section may have three different vertical (vertically aligned) panels existing in different planes, including a central panel, side panel, and support panel, Other types of panels, not depicted in the drawings, may also be part of a modular wall.

The term "surface" as used herein means any outer or inner face of a body or thing, such as a wall, wall section, or panel. A "surface" may be, for example, any flat or substantially flat outer portion of a wall or section or panel, including, for example, any part or all of the rectangular flat portion of a wall section extending from the bottom of the wall section to the top of the wall section, and extending from the left side of that wall section to the right side of the wall section. A surface may also refer to that flat or substantially flat portion of one of the side panels, including the left or right side panel of a wall section, which may, for example, be part of a left or right ledge of a wall section, which may be located on the outer left side and outer right side of a wall section. As the term "surface" is used herein, for example, a modular wall section may have a central wall surface, which may be flat and be the largest surface of the wall section, and may also have a side panel which also has a wall surface, and may also have a support panel, which may also have a wall surface. Other surfaces include a top surface of a wall section, and various individual surfaces of the clip.

The term "slot" as used herein means any narrow, elongated depression, groove, slit, or aperture, including a narrow opening for receiving something, e.g., a prong of a clip.

The term "integral" as used herein describes any structure or object that is integrated into, or is a part of, a larger structure or object. For example, a wall panel and a side panel may each be separate structures that are non-integral but are connected (directly or indirectly) to one another, forming separate parts of a wall or wall section; or they may alternatively be integral parts of the wall or wall section forming a unitary structure. As another example, a side member and support member may be integral parts of a ledge or alcove.

The term "providing" as used herein means making available, furnishing, supplying, equipping, or causing to be placed in position.

The term "connected" as used herein means coupled, which means attached, joined, fastened together, affixed, or directly or indirectly influenced by.

The term "clip" as used herein means any device or structure that is preferably capable of gripping another device or structure, e.g., by the use of prongs or otherwise. Various parts of the clip, e.g., the plates and prongs, may be separate, i.e., non-integral but attached or connected together, or they may be integral, i.e., formed, stamped or molded as part of a unitary structure.

The term "prong" as used herein is defined as any tab, protrusion, or extension which can be part of a clip, e.g., integral with the rest of the parts of the clip forming a unitary whole clip, such as one of the plates; or may alternatively be a separate structure that is connected to the rest of the clip.

The term "disposed within" as used herein means having been put, placed, positioned, inserted, or oriented in a particular location. For example, when a prong has been inserted into a slot, it is disposed within that slot. It is also disposed within the support member that includes the slot and the wall section and wall as well.

The terms "first" and "second" as used herein merely differentiates two or more things or actions, and do not signify anything else, including order of importance, sequence, etc.

The term "adjacent" as used herein means next to and includes physical contact but does not require physical contact.

The term "vertical" as used herein is defined as being in a position or direction substantially perpendicular to the intended plane of the surface on which a wall or building is to be situated.

The term "aligned" as used herein means manufactured, formed, or adjusted in a line; or positioned in relation to something else. For example, one prong may be aligned vertically or vertically aligned meaning that the prong is oriented so that its largest surface is co-planar with a vertical axis. A first slot. (e.g., a lower slot) may be axially aligned with a second slot (e.g., an upper slot) when an axis passing through the longest part of the first slot lines up with an axis passing through the longest part of the second slot.

The term "elongated" as used herein describes something that is long and thin, which at the very least means that the length is longer than the width, preferably 5 or more times as long as wide.

Figure 3:
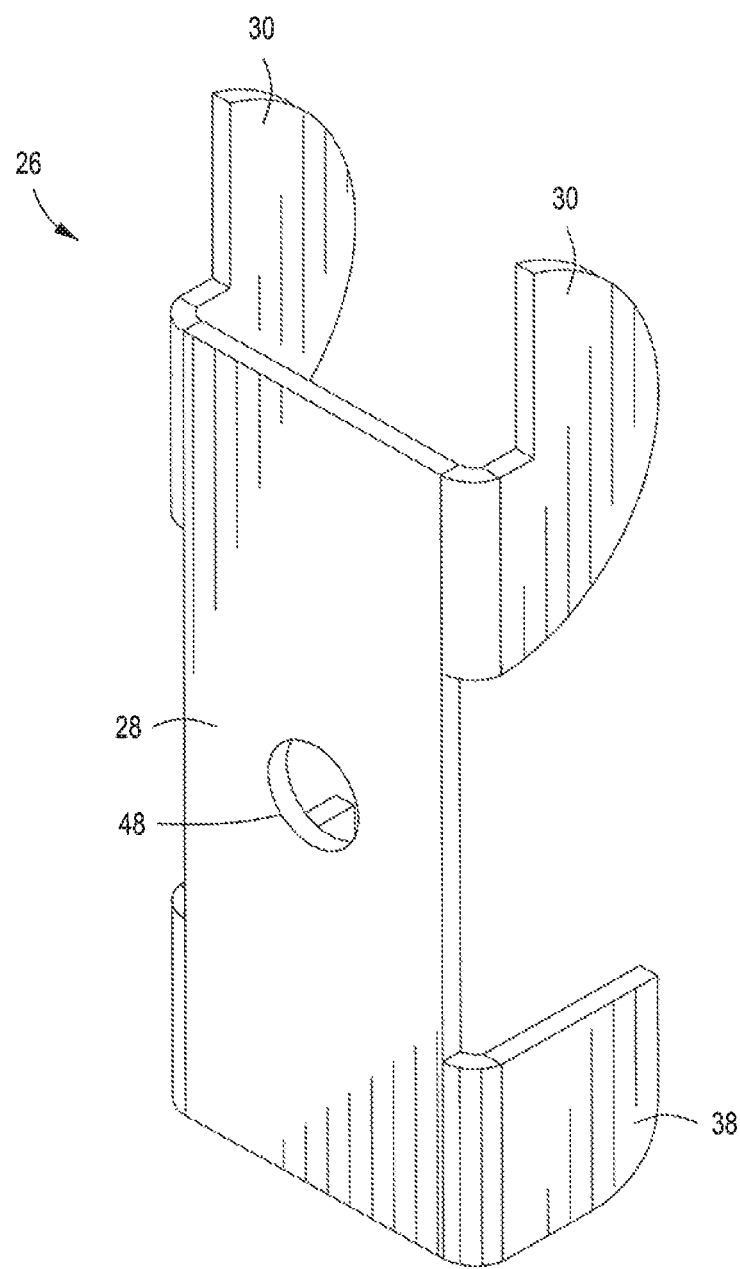
FIG. 3 shows one type of clip used to connect two modular wall sections.
Figure 4:
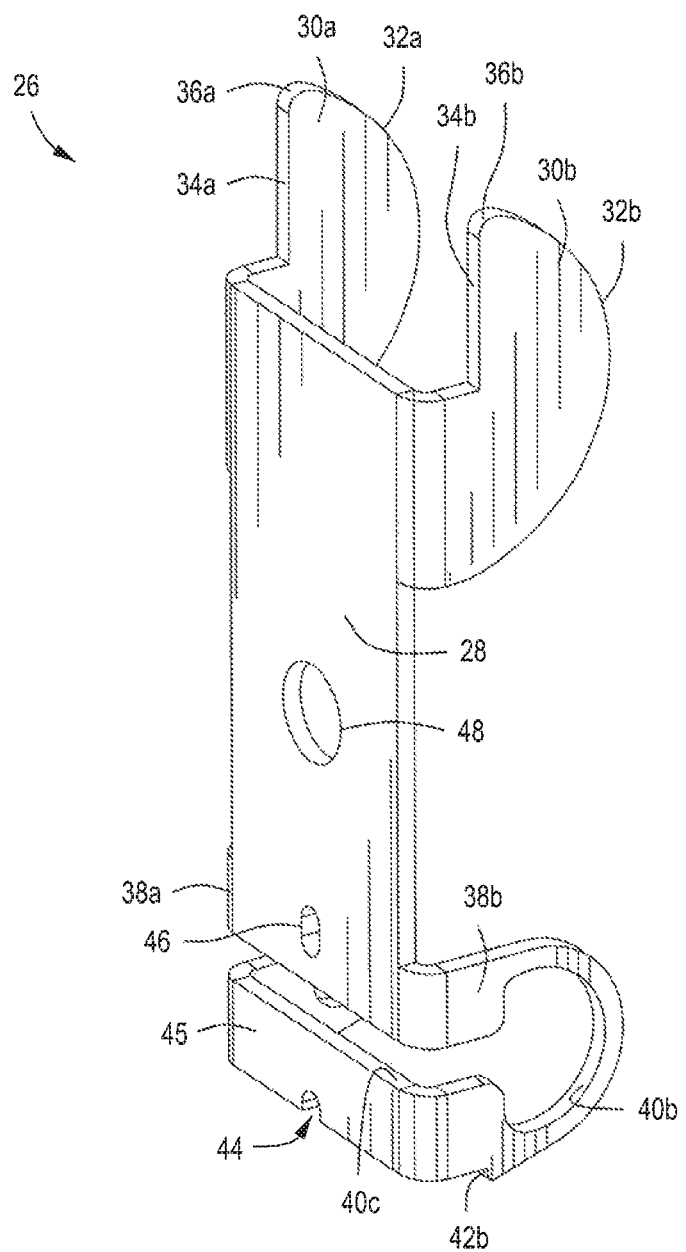
FIG. 4 shows another type of clip.

The term "edge" as used herein means any line or border at which any surface terminates, or any line at which two surfaces of a solid object meet. For example, the upper prongs for certain clips disclosed herein have a convex curved edge as seen in FIGS. 3 and 4. Also, the central or main wall surface 12a of certain wall sections disclosed herein form an edge at the line where they meet with the side wall surface 12b. Similarly, the side wall surfaces 12b form an edge where they meet with central or main wall surface 12a and another edge where they meet with outer wall surfaces 12c. Also, the upper and lower plates that are parts of certain clips disclosed herein each have upper and lower edges and also have side edges.

The terms "upper" and "lower" as used herein are relative terms describing the position of one object, thing, or point positioned in its intended useful position, relative to some other object, thing, or point also positioned in its intended useful position, when the objects, things, or points are compared to distance from the center of the earth. For example, the term "upper" identifies any object or part of a particular object that is farther away from the center of the earth than some other object or part of that particular object, when the objects are positioned in their intended useful positions. For example, a modular wall and a modular wall section each has an upper edge and a lower edge, relative to one another, when the wall or wall section is positioned and oriented with the largest surface of the wall or wall section being parallel to an axis perpendicular to the earth surface, and as part of a room or building in its final installed condition. Similarly a clip can have prongs that are referred to as upper and lower prongs based on the clip being installed as part of a modular wall, or as part of the connection between two modular wall sections, where the largest surface of the clip is parallel with the largest surface of each modular wall section.

The term "curved" as used herein describes any edge or surface that has the shape of a curve, including an edge that follows a continuously bending line without any angles, and also can describe any continuously bending surface.

The term "space" as used herein means any volume or area. For example, it may refer to some empty volume or area between two objects, structures, points, lines, edges, or surfaces, i.e., not occupied by any anything solid. The term space may also refer to the area of some surface, e.g., the two-dimensional space defining a wall surface.

The term "gap" as used herein is defined as any space between two solid objects that is not occupied by anything solid, i.e., empty space. For example, as described herein for certain clips, a gap exists between one part of the clip, e.g., an upper plate, and another part of the clip, e.g., a lower plate.

The term "aperture" as used herein is defined as any opening in a solid object or structure, including an opening that begins on one side of the solid object and ends on the other side of the object, as well as an opening that does not pass entirely through the object, and an aperture can be an opening in an object that is completely circumscribed, defined, or delimited by the object itself or the object in combination with one or more other objects or structures.

The term "member" as used herein is defined as any structure that is part of some larger structure. For example, various clips disclosed herein include certain members that are prongs, and the prongs have members that are parts of those prongs. For example, certain lower prongs disclosed herein include members that are ring-shaped, Certain upper prongs also may include members that are parts of those upper prongs. A modular wall or wall section may include members that are part of the modular wall or wall section, such as support members, outer panels as illustrated in the drawings.

The term "ring-shaped" as used herein means having the shape of a ring, wherein the ring can be circular or have some other geometric shape. Certain lower prongs disclosed herein include ring-shaped members preferably having an aperture defining a space within the member.

The term "thickness" as used herein is defined as the measure of the smallest dimension of a structure or given space, e.g., the thickness of the circular metallic portion of the ring-shaped lower prong; or the thickness of a gap between a particular upper plate and a lower plate of a clip; or the thickness of a slot that is capable of receiving a prong; or the thickness of a particular prong.

The term "notch" as used herein means any indentation in the side or edge of any structure, preferably an angular or v-shaped indentation. For example, certain clips disclosed herein have a notch on the lower edge of a lower plate of such clips.

The terms "long side" and "short side" as used herein are relative terms, and refer to two different sides of a particular structure. When referring to the two sides, the long side is longer than the other side, which is the short side.

The term "unitary" as used herein means having the nature, properties, or characteristics of a single unit. For example, the prongs and plates that are individual parts of the clip are unitary in the sense they work together to fulfill the intended purpose of the clip. Also, the different panels of the wall section and the clips and strut channels are unitary where they are connected, directly or indirectly, and fulfill the intended purpose of the modular wall assembly.

The term "axis" as used herein is defined as any actual or imaginary line running through a central part of any elongated space, such as a slot or open channel.

The term "strut channel" as used herein means any elongated member having an open channel along its axis. The channel preferably has a rectangular cross-section when viewed from one of the ends. The channel is preferably bounded by three elongated plates that are preferably integral with one another so that the strut channel is a single unitary piece and the plates are different parts of the strut channel. A strut channel is preferably a structure that is formed from a metal sheet folded over into an elongated rectangular-shaped open channel with a central plate and two side plates.

The term "ledge" as used herein means a shelf or a planar surface projecting from, and at a different angle than, another planar surface.

The terms "core section" and "core segment" as used herein mean any solid structure that is, or is capable of being, positioned or located between panels, e.g., the support panels of opposing wall sections, e.g., inner and outer support panels. At least one example of a core section (also referred to as "core segment") is depicted in drawings herein, e.g. FIG. 9.

The term "alcove" as used herein means any recessed space, including hut not limited to recessed space formed by two panels intersecting at an angle such as a side panel and a support panel as shown in NG. 2, The term "alcove" also refers to the recessed space between adjoining wall sections, which space is defined by two sets of support panels and side panels and/or their corresponding surfaces.

The term "transverse" as used herein means lying or extending across or in a cross direction.

3. Certain Specific Embodiments

Certain specific embodiments of methods, structures, elements, and parts are described below, which are by no means an exclusive description of the inventions. Other specific embodiments, including those referenced in the drawings, are encompassed by this application and any patent that issues therefrom. Various modular enclosures, e.g., buildings, building structures, or elements or parts of building structures, are discussed below and elsewhere herein.

Certain specific embodiments disclosed herein include modular enclosures for temperature-sensitive components, or parts that can be assembled into modular enclosures, e.g., building structures, which include a modular wall section that includes a vertical support panel, a vertical strut channel connected to the vertical support panel, and optionally also a temperature-sensitive component connected to the vertical strut channel.

Certain specific embodiments disclosed herein include modular enclosures for temperature-sensitive components, or parts that can be assembled into modular enclosures, or other building structures, which include a first modular wall section; a second modular wall section; a vertical strut channel; and optionally also a temperature-sensitive component, wherein the first and second modular wall sections are connected to form a vertical alcove between the first and second modular wall sections; the vertical strut channel is disposed in the vertical alcove, and the temperature-sensitive component is or can be connected to the vertical strut channel.

Certain specific embodiments disclosed herein include a modular enclosure for temperature-sensitive components, or parts that can be assembled into modular enclosures. or other building structures, wherein the modular enclosures or other building structures can include an outer portion and an inner portion, and further include a first inner wall, a first inner support panel, a second inner wall, a second inner support panel; a first outer wall, a first outer support panel, a second outer wall, a second outer support panel, optionally a temperature-sensitive component and a core section, wherein: the first inner support panel is integral with the first inner wall or is adjacent to and connected to the first inner wall; the second inner support panel is integral with the second inner wall or is adjacent to and connected to the second inner wall; an inner connecting member connects the first inner support panel to the second inner support panel to form an inner alcove; the first outer support panel is integral with the first outer wall or is adjacent to and connected to the first outer wall; the second outer support panel is integral with the second outer wall or is adjacent to and connected to the second outer wall; an outer connecting member connects the first outer support panel to the second outer support panel to form an outer alcove; the core section is disposed between the first and second alcoves; an inner strut channel is disposed within the inner alcove; an outer strut channel is disposed within the outer alcove; and a transverse member extends through the core section to connect the inner strut channel to the outer strut channel; and the temperature-sensitive component is or can be connected to the inner strut channel.

Certain specific embodiments disclosed herein may include modular enclosures or parts thereof, or other building structures, which include a modular wall section that includes a vertical support panel and a vertical strut channel connected to the vertical support panel.

Certain specific embodiments disclosed herein may include modular enclosures or parts thereof, or other building structures, that include a first modular wall section; a second modular wall section; an alcove between the first and second modular wall sections; and a vertical strut channel disposed in the alcove.

Certain specific embodiments disclosed herein may include modular enclosures or parts thereof, or other building structures, that include a first modular wall section that includes a first vertical support panel, a second modular wall section that includes a second vertical support panel and a vertical strut channel disposed between portions of the first and section modular wall sections.

Certain specific embodiments disclosed herein may include modular enclosures or parts thereof, or other building structures, that include a first modular wall section; a second modular wall section; a vertical strut channel; wherein the first and second modular wall sections are connected to form a vertical alcove between the first and second modular wall sections; and the vertical strut channel is disposed in the vertical alcove.

Certain specific embodiments disclosed herein include modular enclosures or parts thereof, or other building structures, that include: a first modular wall section that includes a first support panel connected to a second modular wall section that includes a second support panel, wherein: the first support panel includes a first ledge; the second support panel includes a second ledge; and a channel strut is connected to the first ledge and the second ledge.

Certain specific embodiments disclosed herein include modular enclosures or parts thereof, or other building structures, that include a first modular wall section that comprises a first vertical support panel; a second modular wall section that comprises a second vertical support panel; a vertical strut channel; wherein the first vertical support panel and the second vertical support panel are connected to form an alcove between the first and second vertical support panels; and a portion of the vertical strut channel is disposed against the first vertical support panel and a portion of the vertical strut channel is disposed against the second vertical support channel.

Certain specific embodiments disclosed herein include modular enclosures having an outer portion and an inner portion, comprising: a first inner wall, a first inner support panel, a second inner wall, a second inner support panel; a first outer wall, a first outer support panel, a second outer wall, a second outer support panel, and a core section, wherein: the first inner support panel is integral with the first inner wall or is adjacent to and connected to the first inner wall; the second inner support panel is integral with the second inner wall or is adjacent to and connected to the second inner wall; an inner connecting member connects the first inner support panel to the second inner support panel to form an inner alcove; the first outer support panel is integral with the first outer wall or is adjacent to and connected to the first outer wall; the second outer support panel is integral with the second outer wall or is adjacent to and connected to the second outer wall; an outer connecting member connects the first outer support panel to the second outer support panel to form an outer alcove; the core section is disposed between the first and second alcoves; an inner strut channel is disposed within the inner alcove; an outer strut channel is disposed within the outer alcove; and a transverse member extends through the core section to connect the inner strut channel to the outer strut channel.

In any one or more of the modular enclosures or other building structures disclosed herein, the temperature-sensitive component can be selected from the group consisting of: SCADA systems, RTU's, control panels, flow computers, gas chromatographs, storage batteries, computers and servers, radio transmitters and receivers, generators, compressors, and pumps.

One or more of the modular enclosures or other building structures disclosed herein may also include a metallic member extending between the first and second modular wall sections, wherein the metallic member holds the first and second modular wall sections together.

One or more of the modular enclosures or other building structures disclosed herein may also include a clip holding the first and second modular wall sections together.

One or more of the modular enclosures or other building structures disclosed herein may also include a first modular wall section has one or more first vertical slots; the second modular wall section has one or more second vertical slots; the building structure further including one or more clips with prongs disposed into the first and second vertical slots; and the building structure further including an elongated metallic member having a U-shaped profile viewed from either end of the elongated metallic member with two facing elongated side portions and an elongated central portion between and connecting the two facing side portions, wherein the elongated central portion has aperture and the elongated metallic member is disposed against the one or more clips.

One or more of the modular building structures or other building structures disclosed herein include an enclosure that includes a temperature-sensitive component attached to the strut channel.

Certain specific embodiments or other building structures disclosed herein include modular building structures that include: a wall panel; a support panel that includes a slot and is integral with the wall panel or connected to the wall panel; a clip that includes a prong disposed within the slot; and a vertical strut channel.

Any one or more of the modular enclosures of other building structures disclosed herein can include: a first wall and a first support panel connected to a second wall and a second support panel, wherein: the first support panel is integral with the first wall or is adjacent to and connected to the first wall; the second support panel is integral with the second wall or is adjacent to and connected to the second wall; the first support panel includes two first vertical elongated slots; the second support panel includes two second vertical elongated slots; and a clip having two prongs disposed within the two first vertical elongated slots and two prongs disposed within the two second vertical elongate slots.

Any one or more of the modular enclosures or other building structures disclosed herein can include: a first wall panel comprising a first support panel having a first elongated upper slot and a second elongated lower slot; a second wall panel comprising a second support panel having a first elongated upper slot and a second elongated lower slot; and a clip that includes: a first upper prong disposed within the first upper slot of the first support panel; a first lower prong disposed within the first lower slot of the first support panel; a second upper prong disposed within the second upper slot of the second support panel; and a second lower prong disposed within the second lower slot of the second support panel.

Any one or more of the modular enclosures or other building structures disclosed herein can include a clip that may include: a first upper prong capable of being disposed within an upper slot of a first support panel; a first lower prong capable of being disposed within a lower slot of the first support panel; a second upper prong capable of being disposed within an upper slot of a second support panel; and/or a first lower prong capable of being disposed within a lower slot of the second support panel.

Any one or more of the modular enclosures or other building structures disclosed herein may include a first upper prong that may have a curved outer edge that fits into the upper slot of the first support panel and a second upper prong that may have a curved outer edge that fits into the upper slot of the second support panel.

Any one or more of the modular enclosures or other building structures disclosed herein may have a clip that may have a plate with an upper edge and a lower edge; a first upper prong and a second upper prong which may each have a top portion and a bottom portion; and wherein a top portion of the first upper prong and the second upper prong may extend above the upper edge of the plate of the clip.

Any one or more of the modular enclosures or other building structures disclosed herein may include a clip that includes: a first plate to which is connected a first upper prong, a second upper prong, a first lower prong, and a second lower prong; and a second plate to which are connected the first and second lower prongs, wherein the second plate is separated from the second plate by space the forms a gap between the first plate and the second plate.

Any one or more of the modular enclosures or other building structures disclosed herein may include first and second lower prongs that include an aperture.

Any one or more of the modular enclosures or other building structures disclosed herein may include first and second lower prongs that each include a ring-shaped member that defines a space separating the top portion of the ring-shaped member from the bottom portion of the ring-shaped member, in which the vertical distance of the space separating the top portion of the ring-shaped member from the bottom portion of the ring-shaped member is greater than the thickness of the ring-shaped member.

Any one or more of the modular enclosures or other building structures disclosed herein may include a second plate that includes a notch on the lower edge of the second plate.

Any one or more of the modular enclosures or other building structures disclosed herein first plate includes an aperture positioned on the lower half of the first plate in vertical alignment with the notch on the lower edge of the second plate.

Any one or more of the modular enclosures or other building structures disclosed herein may include a first plate that includes an aperture positioned on the lower half of the first plate.

Any one or more of the modular enclosures or other building structures disclosed herein may include a support panel having at least one long side and at least one short side, wherein the long side is longer than the short side.

Any one or more of the modular enclosures or other building structures disclosed herein may have a support panel with a vertical side and a slot that is elongated and has a vertical side that is substantially parallel to the vertical side of the support panel.

Any one or more of the modular enclosures or other building structures disclosed herein may have two or more slots.

Any one or more of the modular enclosures or other building structures disclosed herein may have a wall panel and a support panel that are integral with one another and form part of the same unitary wall panel structure.

Any one or more of the modular enclosures or other building structures disclosed herein may have a support panel that includes two slots and a clip that includes two prongs capable of being disposed within the two elongated slots.

Any one or more of the modular enclosures or other building structures disclosed herein may have a support panel that includes two slots aligned with one another along an axis and a clip that includes two prongs on one side of the clip and being capable of being disposed within the two elongated slots.

Any one or more of the modular enclosures or other building structures disclosed herein may be or include a wall comprising at least two wall panels connected to one another, each wall panel including a support panel that includes a slot; each wall panel further including a clip that includes a prong capable of being disposed within the slot.

Any one or more of the modular enclosures or other building structures disclosed herein may be or include a wall or alternatively be a building, or roof.

Any one or more of the modular enclosures or other building structures disclosed herein may include a strut channel.

Any one or more of the modular enclosures or other building structures disclosed herein may include first and second elongated upper slots in a first support panel that are each parallel with a vertical edge of a wall and second elongated upper slots of the second panel are each parallel with the vertical edge of the second wall.

Any one or more of the modular enclosures or other building structures disclosed herein may include a clip connecting a first support panel to a second support panel wherein the clip comprises: (a) a first clip edge closer to the first support panel than to the second support panel; (b) a second clip edge closer to the second support panel than to the first support panel; (c) two first prongs on or closer to the first clip edge than to the second clip edge, which two first prongs are disposed within the two first slots; and (d) two second prongs on or closer to the second clip edge than to the first clip edge, which two second prongs are disposed within the two second slots.

Any one or more of the modular enclosures or other building structures disclosed herein can include a wall panel; a support panel that includes a vertical ledge and is integral with the wall panel or connected to the wall panel; and a strut channel connected to the vertical ledge.

Any one or more of the modular enclosures or other building structures disclosed herein can include: a first wall and a first support panel connected to a second wall and a second support panel, wherein: the first support panel includes a first ledge and is integral with the first wall or is adjacent to and connected to the first wall; the second support panel includes a second ledge and is integral with the second wall or is adjacent to and connected to the second wall; and a channel strut is connected to the first ledge and the second ledge.

Any one or more of the modular enclosures or other building structures disclosed herein can include an outer portion and an inner portion, comprising: a first inner wall, a first inner support panel, a second inner wall, a second inner support panel; a first outer wall, a first outer support panel, a second outer wall a second outer support panel, and a core section, wherein: the first inner support panel is integral with the first inner wall or is adjacent to and connected to the first inner wall; the second inner support panel is integral with the second inner wall or is adjacent to and connected to the second inner wall; an inner connecting member connects the first inner support panel to the second inner support panel; the first outer support panel is integral with the first outer wall or is adjacent to and connected to the first outer wall; the second outer support panel is integral with the second outer wall or is adjacent to and connected to the second outer wall; an outer connecting member connects the first outer support panel to the second outer support panel; wherein the core section is disposed between the first and second inner support panels and the first and second outer support panels; an inner strut channel is disposed within the inner alcove; an outer strut channel is disposed within the outer alcove; and a transverse member extends through the core section to connect the inner strut channel to the outer strut channel.

4. Specific Embodiments in the Figures

The drawings presented herein are for illustrative purposes only do not limit the scope of the claims. Rather, the drawings are intended to help enable one having ordinary skill in the art to make and use the claimed inventions.

This section addresses specific embodiments of the inventions shown in the drawings, which relate to modular building structures, elements and parts that can be part of a modular building structure, and methods for making modular building structures. Although this section focuses on the drawings herein, and the specific embodiments found in those drawings, parts of this section may also have applicability to other embodiments not shown in the drawings. The limitations referenced in this section should not be used to limit the scope of the claims themselves, which have broader applicability.

Although the methods, structures, elements, and parts described herein have been described in detail, it should be understood that various changes, substitutions, and alterations can be made without departing from the spirit and scope of the invention as defined by the following claims. Those skilled in the art may be able to study the preferred embodiments and identify other ways to practice the invention that are not exactly as described herein. It is the intent of the inventors that variations and equivalents of the invention are within the scope of the claims, while the description, abstract and drawings are not to be used to limit the scope of the invention. The invention is specifically intended to be as broad as the claims below and their equivalents.

Figure 8A:
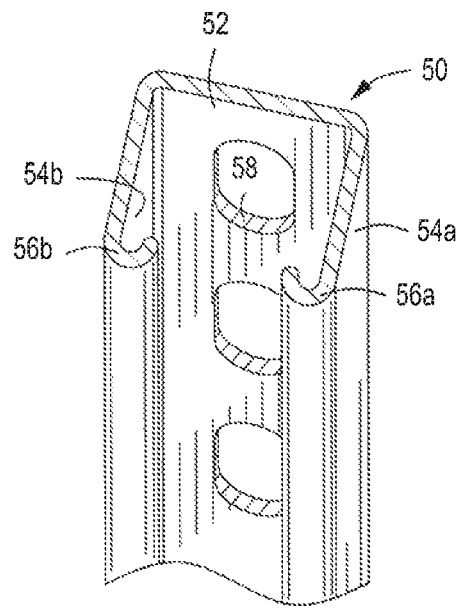
FIG. 8A is a perspective view of a strut channel.

FIG. 1 shows a portion of an enclosure containing two different temperature-sensitive components 60a, 60b, wherein the enclosure has been constructed using modular wall sections such as those described herein. The components 60a, 60b in FIG. 1 are attached to an inside wall that is composed of some of the modular wall sections 10 described herein, e.g., in FIG. 9 Each of the modular wall sections 10 in FIG. 1 can be connected together in adjoining relation using clips 26 or 500 (described elsewhere herein but not shown in FIG. 1), Disposed in the alcove between adjoining wall sections (which alcove can also be considered as part of the wall sections themselves) are strut channels 50, shown in greater detail in FIGS. 8 and 9. A close-up view of the apertures 58 in each strut channel 50 can be seen in FIGS. 8A and 8B. The strut channels 50 in FIG. 1 are vertically aligned (positioned), with the long sides of each strut channels 50 running straight up and down and the concave side facing outward, as shown in FIG. 8A, in FIG. 1, horizontal members, e.g., strut channels 66, are connected to the vertical strut channels 50 using bolts or screws. Advantageously, each of the temperature-sensitive components can be connected to the wall by simply coupling them, e.g., bolting or screwing them, to the horizontal strut channels 66 which are in turn coupled to the vertically-oriented strut channels 50 that are part of the walls themselves. In addition to horizontal strut channels, fixtures such as clamps 64 can be provided so that conduits, e.g., hot water pipes or conduits housing electrical lines can be easily installed in the manner shown in FIG. 1.

The wall in FIG. 1 is an "inside" wall, so that the temperature-sensitive components 60a, 60b are inside the modular enclosure, e.g., the building. Alternatively, the wall can be regarded as a single two-sided wall having an inside surface and an outside surface In certain specific embodiments, there exists an "outside" and an "inside" relative to any particular room or building made using the modular wall sections described herein. Certain rooms can be described as internal rooms, in that the area outside those internal rooms is inside a larger building. Other rooms are contiguous with the outside of the building, in which case the outside of the room is part of, or in contact with, the "natural environment," defined as any space that is heated directly by the sun, sometimes referred to as the "outdoors," Accordingly, depending on natural factors including the seasons, altitude, and geographical location including latitude, the temperature of the natural environment outside the building can range from very hot, e.g., temperatures above 100 degrees F., which naturally exist in the desert during daytime, and in the Gulf of Mexico and southern parts of the United States during summertime in the afternoon, to very cold, e.g., below freezing, which can exist in a variety of places, such as the northern parts of the United States, including Alaska, and in other places having cold climates such as the North Sea.

FIG. 2 shows a modular building structure, specifically a modular wall section 10, which includes an inside wall section (wall panel) 12 with an inside central wall panel 12a, an inside side panel 12b, and an inside support panel 12c. The modular wall section (which may include all three inside panels) has a wall surface which in FIG. 2 faces the inside of a room or building and therefore is regarded as an inside wall surface. That wall surface includes an inside wall surface for the inside central panel 12a, a surface of the inside modular side panel 12b, and an inside support wall surface for panel 12c. Wall surface for panel 12b is disposed at a right angle (perpendicular) to the wall surface for panel 12a, which meets (joins) with the wall surface for panel 12b at edge 14, which is a rounded corner extending vertically along the line where the wall surfaces for panels 12a, 12b meet. Modular wall section 10 also includes an outside modular central wall panel 12a', an outside modular side panel 12b', and an outside modular support panel 12c'. In FIG. 2, the outside of the modular wall section 12' (which includes all three outside panels) includes a surface facing the outside of the room or building (directed into this page and away from the reader) and therefore is regarded as an outside wall surface. That wall surface includes an outside wall surface, an inside side wall surface, and an inside support wall surface corresponding to panels 12a', 12b' and 12c'. The wall surface is considered to be part of side wall panel 12b' and is disposed at a right angle (perpendicular) to the wall surface for central panel 12a', which meets (joins) with wall surface for panel 12b' at edge 14', which is a rounded corner extending vertically along the line where wall surfaces for panels 12a', 12b' meet.

Not shown in FIG. 2 is insulation material such as foam insulation, disposed between inside wall panel 12 and outside wall panel 12'. Top wall panels 15 and 15' cover the space between wall surfaces 12a and 12a' as well as any insulation material therein. Top wall panels 15 and 15' may have downwardly extending wings (not shown) that extend partially down along the insides of the wall panels 12a, 12a' and can be attached to those wall panels from the outside using screws 13 or any other conventional or novel attachment means, e.g., nails, bolts, clamps, clips, brackets, or rivets, glue, or tape. Alternatively, the top wall panels may be integrated (integral) with the other panels, i.e., formed as a unitary structure.

Any vertical planar portion of a modular wall section may be referred to generally, as a "wall." Similarly, an individual panel, modular wall section, and combination of modular wall sections may also each be referred to as a "wall." As contemplated herein, modular wall (or wall section) 10 is part of a combination of modular walls that define and enclose a space, such as a room, or the inside of a house or office building. In the case of a room, one side of the wall can be referred to as an inside wall, facing (for example) the "inside" of the room, and the other side of the wall can be referred to as the "outside" wall, facing the "outside" of that room. Alternatively, the two sides of the wall that face in opposite directions can be referred to as a "first side" and a "second side" of a wall or alternatively simply as a "side" and an "opposite side," which terms are applicable, for example, to panels 12a and 12a' and their corresponding surfaces.

Figure 9:
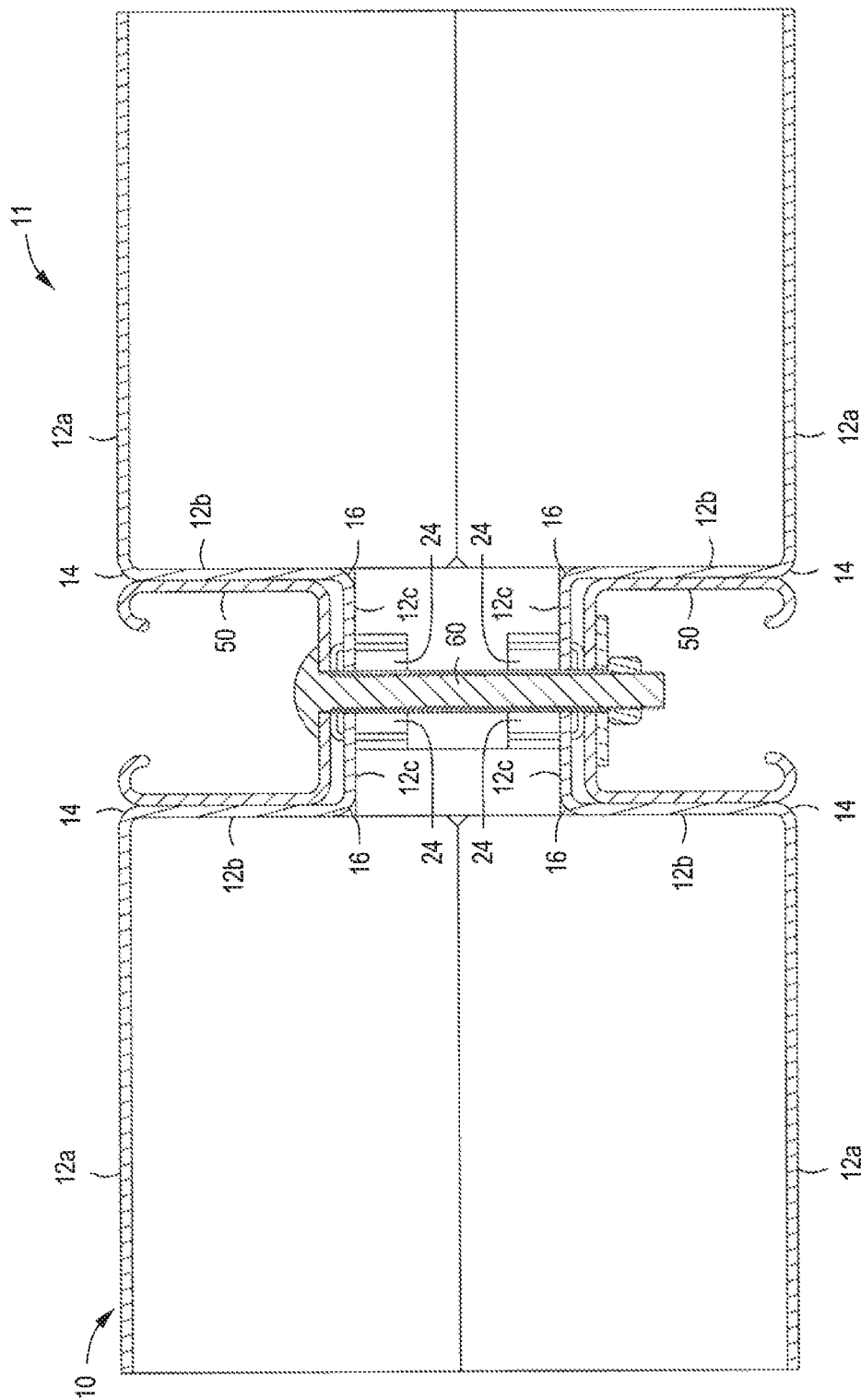
FIG. 9 is a top view of a modular wall that includes two modular wall sections connected together.

Still referring to FIG. 2, modular wall 10 includes clip 26, described in greater detail elsewhere herein, which is capable of connecting modular wall 10 to another modular wall, only a portion of which is shown in FIG. 2. That is, only the support panel of the adjoining modular wall on the right can be seen in FIG. 2. As discussed in greater detail elsewhere herein, the support panel 12c of modular wall 10, which includes its corresponding surface has slots 20a, 20b, into which the left-side upper and lower prongs 30a and 38b of clip 26 are disposed (see FIGS. 2 and 3). Another clip 26', which cannot be seen in FIG. 2 because of intervening structures, connects the support panel 12c' (which also cannot be seen) that includes its corresponding surface with the support panel of the adjoining modular wall which also cannot be seen in FIG. 2. Thus, the modular wall 10 in FIG. 2 is designed to have a total of eight clips 26 connecting that modular wall 10 to an adjoining modular wall (not shown). There are four clips on the inside wall and four clips on the outside wall, although only one of the clips is shown as being installed in FIG. 2. The support panel of the adjoining wall that is connected to modular wall 10 via the clips 26, 26' include slots 21a, 21b, into which the right-side upper and lower prongs 30b, 38b, of clip 26 (FIG. 4) are disposed, and 30, 38 of clip 26 in FIG. 3. Core segment 22 is disposed between support panels of the opposing wall surfaces, specifically a solid elongated rectangular structure with four rectangular sides between the support panel 12c and the opposite support panel 12c' (i.e., facing in the opposite direction), Preferably the two outwardly facing opposite sides of the core segment 22 are in physical contact with the inner surfaces of the support panels 12c, 12c'. Bolt 60 extends through at least clip 26, core segment 22, and clip 26' (not seen in FIG. 2). A more complete illustration of bolt 60 is in relation to the support panels and core segment 22 can be seen in FIG. 9, which also includes strut channel 50. In FIG. 9 it can be seen that bolt 60 also extends through the inside and outside strut channels 50, FIG. 3 shows clip 26 including plate 28, a pair of upper prongs 30 and a pair of lower prongs 38. Plate 28 includes aperture 48 through which bolt 60 is capable of fitting, as discussed above and elsewhere herein, including the discussion of FIG. 9. The upper prongs 30 preferably have the same shape and dimensions as upper prongs 30a, 30b of clip 26 shown in FIG. 4, discussed below. The lower prongs 38 in FIG. 3 each has a different shape and dimensions than lower prongs 38a, 38b in FIG. 4. For example, although lower prongs 38 have no aperture as do lower prongs 38a, 38b, lower prongs 38 have a lower edge that is slightly curved and rounded so that it can easily slide into the lower slots when the clip is being installed.

FIG. 4 shows clip 26, which is similar to clip 26 in FIG. 3 but has certain parts that have different shapes and dimensions. In FIG. 4, clip 26 includes upper plate 28, a pair of upper prongs 30a, 30b and a pair of lower prongs 38a, 38b. Upper plate 28 includes aperture 48 through which bolt 60 is capable of fitting, as discussed with reference to FIG. 9, In FIG. 4, clip 26 is designed to preferably be used as part of any modular wall structure including but not limited to those shown in the other figures and described elsewhere herein. For example, clip 26 in FIG. 4 may be used as part of the modular wall structure 10 shown in FIGS. 2, 6-7, and 9 in which case it is understood that clip 26 from FIG. 4 is used in the place of clip 26 from FIG. 3. Clip 26 (either from FIG. 2 or FIG. 3) can be used with a support panel or any similar surface or structure that includes slots shaped to receive the prongs of the clip. Clip 26 (FIG. 4) has a first left-side upper prong 30a capable of being disposed within upper slot 20a of a first support panel (FIG. 2); and a first left-side lower prong 38a capable of being disposed within lower slot 20b of the first support panel 12c (FIG. 2). Clip 26 (in FIG. 4) also has a second right-side upper prong 30b capable of being disposed within an upper slot 21a of a second adjoining support panel, and a first right-side lower prong 38b capable of being disposed within a lower slot 21b of the second adjoining support panel. The second support panel 12c" is shown in FIG. 2, but is shown without any corresponding wall panel or wall panel which are preferably included in any modular wall system that includes two adjoining modular walls connected via the clips 26, 26'.

In FIG. 4, clip 26 has a first plate 28 which is preferably an upper plate (relative to the lower plate) and to which is connected (and is preferably integral with) the first upper prong 30a, the second upper prong 30b, the first lower prong 38a, and the second lower prong 38b. Clip 26 also has a second plate 45 which is preferably a lower plate (relative to the upper plate) and to which is connected the first and second lower prongs 38a, 38b. The second plate 45 is separated from the first plate by space which thus forms a gap, preferably rectangular, between the first plate 28 and the second plate 45. Preferably, the gap is continuous as shown in FIG. 4, extending to form the apertures in the lower prongs 38a, 38b.

Plate 28 has an upper edge and a lower edge. Referring to FIG. 4, the first upper prong 30a and the second upper prong 30b each has a top portion 36a, 36b with tips in the shape of a rounded point having a radius of curvature wherein the lines forming the edges have an angle between 30 and 45 degrees. Prong 30 of clip 26 in FIG. 4 can have an identical shape, as depicted therein. Prongs 30, 30a, 30b also each have a bottom portion with bottom edges. The top portions 36a, 36b, of the first upper prong 30a and the second upper prong 30b extend above the upper edge of the first plate 28. The first upper prong 30a also has a curved outer edge 32a that is capable of fitting into the upper slot 20a of the first support panel and the second upper prong 30b also has a curved outer edge 32b that is capable of fitting into the upper slot 20a of the second support panel. The first and second upper prongs 30, 30a, 30b preferably have tips which are preferably rounded as shown in FIGS. 3 and 4, and are formed by the intersection between the outer curved edges the inside straight vertical edges of upper prongs 30, 30a, 30b.

Figure 5A:
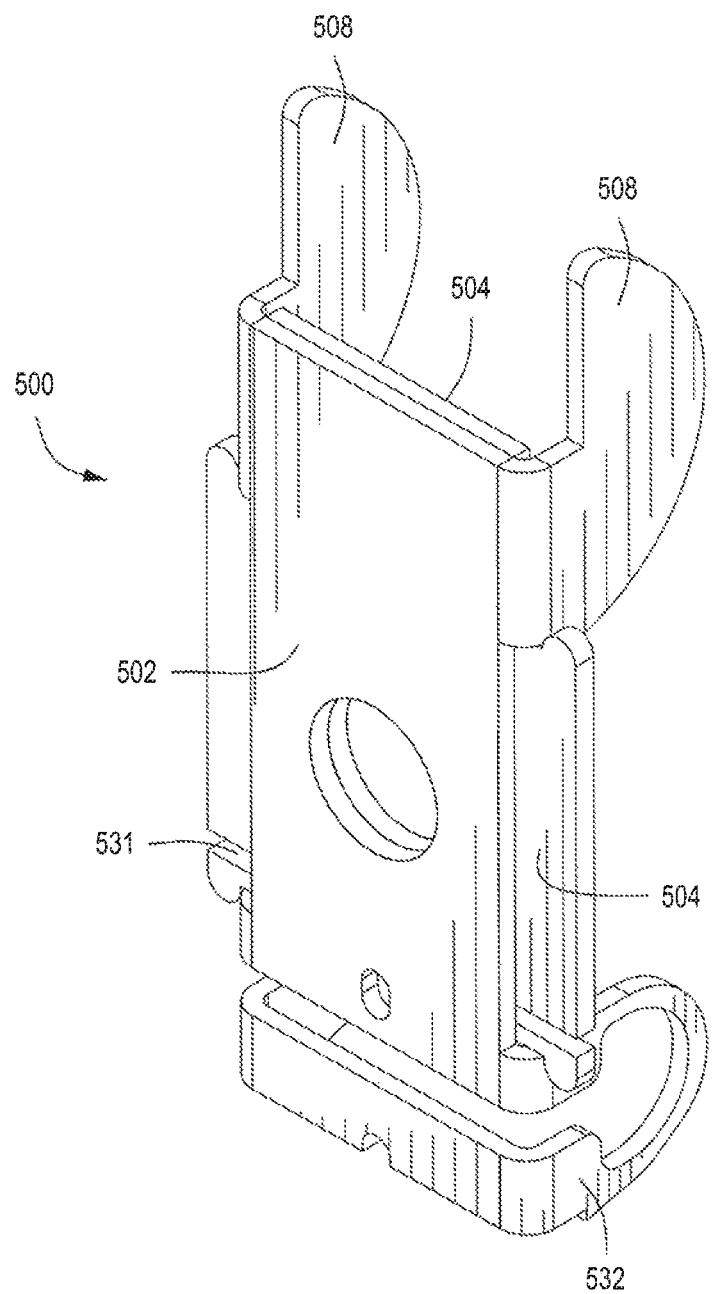
FIG. 5A shows an isometric view of yet another type of clip.
Figure 5B:
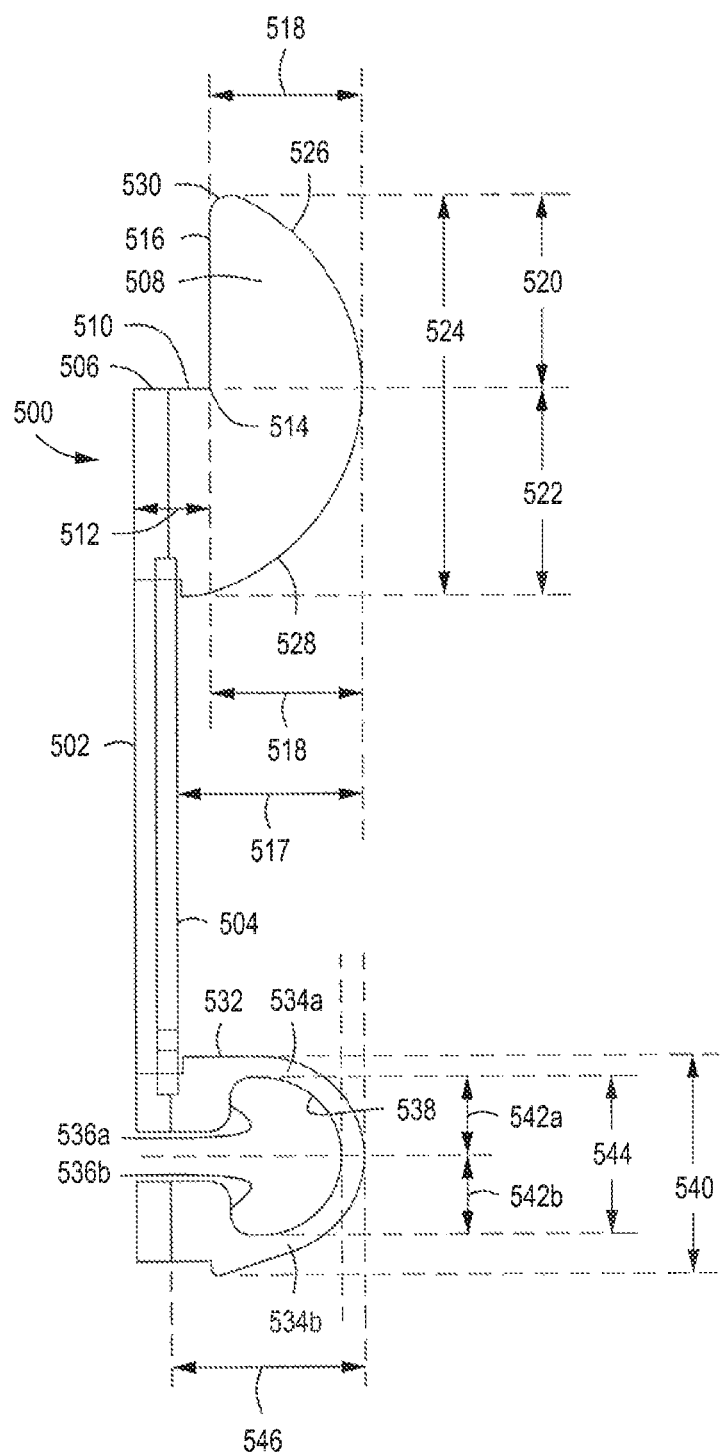
FIG. 5B is a side view of the clip in FIG. 5A.

Yet another clip 500 is depicted in FIGS. 5A and 5B, which is similar in many respects to clip 26 in FIG. 3 and clip 26 in FIG. 4. The shapes and location of the upper prongs 508 and lower prongs 532 are virtually identical to the upper and lower prongs of the clip 26 in FIG. 4. (Only the right-side clips are visible in FIG. 5B.) Referring to FIGS. 5A and 5B, one of the differences between clip 500 and clip 26 in FIG. 4 is that clip 500 has an upper plate that includes two sub-plates or layers 502, 504 which can be connected in some manner, e.g., by being welded or glued, whereas the upper plate in clip 26 in FIG. 4 is or has only a single layer. When the clip 500 is installed, the inner layer or sub-plate 504 preferably abuts the surfaces of two adjoining support panels 12c (see FIG. 9). The width of sub-plate or plate layer 504 is greater than the width of subplate or plate layer 502 and each side of plate 504 has an upper portion that extends upward above the lower edge of the upper prongs and is rounded and a lower portion that extends downward below the upper edge of the lower prongs and is also rounded. The lower portion of the upper plate also includes or has next to it a gap 531 which provides flexibility to the lower portion of the upper plate. The upper plate of clip 500 which is formed of two sub-plates or layers 502, 504, has an upper edge 506, which is flush with the middle horizontal edge 510 of upper prong 508. That middle horizontal edge 510 intersects at corner 514 with the inner vertical edge 516 of upper prong 508, which is more than twice the distance 512 of the length of the combined edges 506 and 510 (viewed from the side). The length of the middle horizontal edge is approximately the same as the thickness of the support panel 12c, which is also the thickness of the upper slot, i.e., the distance from one side of the slot to the other side. The length of the middle horizontal edge is the same as the distance 529 minus the distance 518. The upper prong 508 also has an outer edge 526 and 528 which is rounded, preferably curved in a semi-circular arc, but note the arc extends less than one-half of a circle, as seen in FIG. 5B. The horizontal distance 518 from the inner corner 514 to the outermost part of outer edge 526 is preferably less than either the vertical distance 520 from the inner corner 514 to the uppermost portion of the edge 526 of upper prong 508, which is preferably a rounded tip 530 forming an angle of less than 45 degrees when a tangential line is drawn along the outer edge of the upper portion 526 of prong 508 intersecting with a line extending inside vertical edge 508. Preferably, the distance 522 from the inner corner 514 to the lowermost part of edge 526 of prong 508 is the same as distance 520, with the combined vertical distance or length 524 of the prong being sufficient for the clip to be supported when the prongs are inserted into the slots in the walls, e.g., the support panels. Note that distance 519 is approximately the same, or slightly greater, than the length of the slot 20a, through which the prongs are inserted and then rotated, as discussed elsewhere herein. An important feature of at least one specific embodiment that includes a clip is the shape of each upper prong 530, and particularly the curvature or arc of each outer edge 526, 528. The distance 520 is greater than the distance 518. Thus, when the upper prong is initially inserted into an upper slot in a support panel, the inside edge 516 slides along close to the upper edge of the slot, as illustrated in FIG. 6B, but there is nevertheless some space between the upper edge of the slot and the upper prong. There is also some spade between the lower edge of the slot and the lower prong, which can also be seen by looking at FIG. 6B, Then when the clip is rotated counterclockwise, as discussed below with reference to FIG. 6B, the outer edge of the upper prong acts as a cam because as it rotates around fulcrum 514, the inside edge 516 of the upper prong begins to push against the upper edge of the prong and the outer edge 526, 528 begins to push against the lower edge of the prong. Advantageously, the rotation of the prong gradually pulls the clip together with the support panel, which aligns the clip and support panel horizontally. As the clip completes its rotation, as seen in FIG. 6C, the clip and support panel are also aligned vertically, and also in the other axis, sometimes referred to as the "z-axis."

Referring still to FIG. 5B, clip 500 has a right-side lower prong 532 which is curved in the form of a semi-circle which has a smaller arc or radius of curvature than the arc or radius of curvature of upper prong 508. The outer edge of the lower prong is circular hut not precisely it the shape of a semi-circle because of the spur at the lower edge. Lower prong 532 includes an upper portion 534a and a lower portion 534b defining an aperture with an outer inside edge 538 and an upper inner inside edge 536a and a lower inner inside edge 536b. The vertical distance 542a from the horizontal axis that bisects the lower prong aperture to the upper outer edge of the lower prong is slightly less than the vertical distance 542b from the horizontal axis bisecting the lower prong aperture to the lower outer edge of the lower prong due to the spur at the lower outer edge of the lower prong. The distance 540 of the vertical length of the lower prong is slightly larger than the length of the lower slot 20b in the support panel 12c so that the lower prong can be inserted into the lower slot. The aperture in the lower slot has an inside edge that is preferably rounded with the largest vertical distance greater than the largest horizontal distance. The vertical distance 546 from the surface of the plate that when installed touches the surface of the support panel proximate the lower slots to the outer edge of the lower clip 532 can be the same as distance 519.

A side-view of clip 500 is seen in FIG. 5B. The upper prongs of clip 500 are identical to the upper prongs of the clip 26 in FIGS. 3 and 4 and the lower prongs of clip 500 are identical to the lower prongs of the clip 26 in FIG. 4. Clip 500 has upper clip.

The shapes, curved outer edges, and relative dimensions and positions of each of the upper prongs in FIGS. 3, 4, 5A and 5B are features with unexpected benefits. For example, a user (e.g., a construction worker) receives benefits when a clip having any or all of those features is used to connect two adjacent support panels that have slots, such as slots 20a, 21a in the support panels 12c shown in FIG. 2.

Figure 7A:
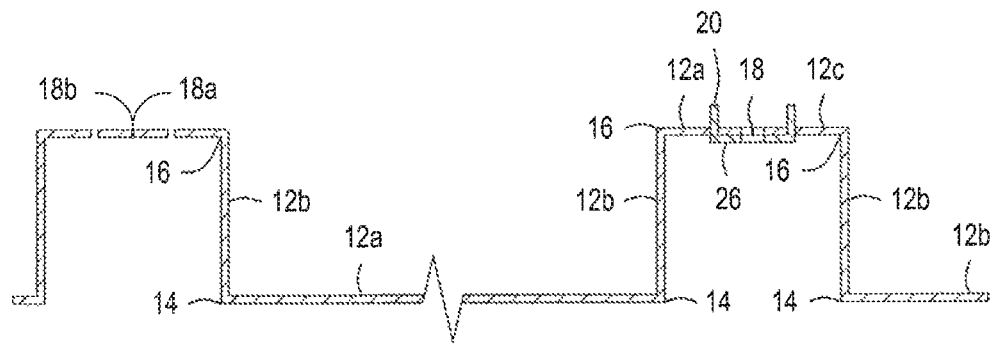
FIG. 7A shows a top sectional view of a portion of modular wall section.

FIG. 7A shows a top sectional view of a portion of modular wall (modular wall section) in FIG. 2, namely, the inner/inside/first modular wall section. A modular wall section depicted in FIG. 7A includes center wall surface 12a; right and left side panels 12b which are located on either side of adjoining center wall panel 12a; and right and left outer support wall panels 12c on either side of side wall panels 12b. FIG. 7A also shows the left and right corners 14 representing the intersections between center wall panels 12 with left and right side wall panels 12b and the inner-directed corners 16 representing the intersections between right and left side wall panels 12b and right and left outer support wall panels 12c. A second modular wall section is seen on the right side of FIG. 7A, which is depicted as being connected via clip 26, More specifically, the outer wall surfaces 12c of each of the modular wall sections are connected to each other via clip 26. In FIG. 7A the upper edge of the first (top) plate 28 of clip 26 can be seen and the tip and part of the top portion of the curved edge of each upper prong can also be seen. Also, FIG. 7A shows how the upper (first) and lower (second) plates of the clip are adjacent to the outer wall surfaces of two adjoining support members which are part of, or connected to, adjoining wall sections. FIG. 7A also shows the interface 18 between the outer edges of the two adjoining wall (sections) (support members/wall surfaces), which are preferably in physical contact with one another but in certain embodiments a narrow gap may alternatively be present between the two adjacent wall sections. A third modular wall section can be seen on the left side of FIG. 7A, which can be connected via a clip (not shown) to the first modular wall section.

Figure 7B:
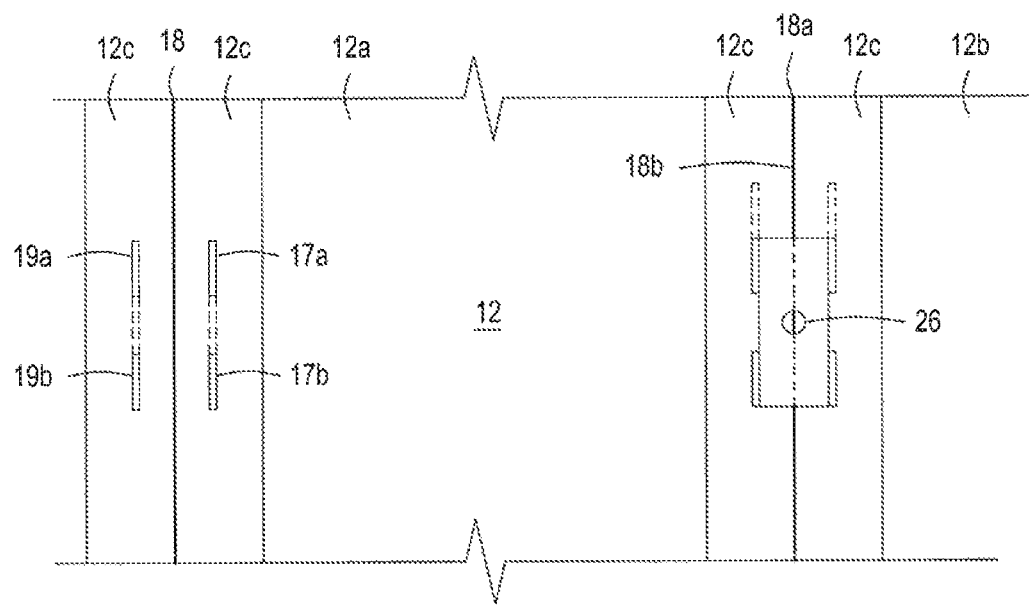
FIG. 7B is a front view of the modular wall section in FIG. 4A.

FIG. 7B is a front view of the modular wall section in FIG. 7A, On the left side of FIG. 7B the upper slots 19a, 17a and the lower slots 19b, 17b are shown without any clip. On the right side of FIG. 7B, clip 26 from FIG. 3 is depicted as being installed. Upper prongs 30 are depicted as having been inserted through (and are therefore disposed in or within) upper slots 20a, 21a; and lower prongs 38 have been inserted through (and are therefore disposed in or within) lower slots 20b, 21b. The broken lines depict the upper portion of upper prongs 30.

Figure 6A:
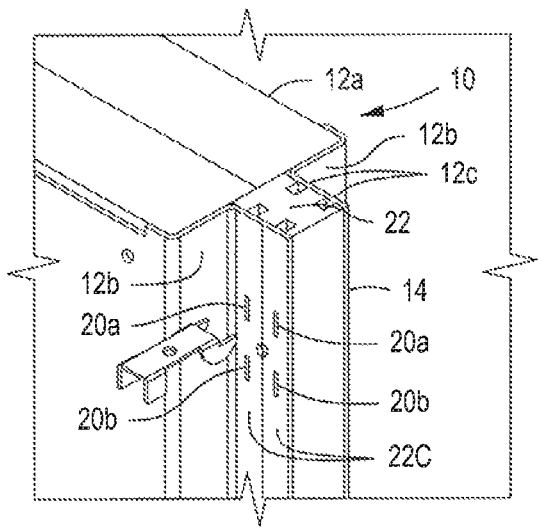
FIG. 6A shows a clip and a wall including a support panel.
Figure 6B:
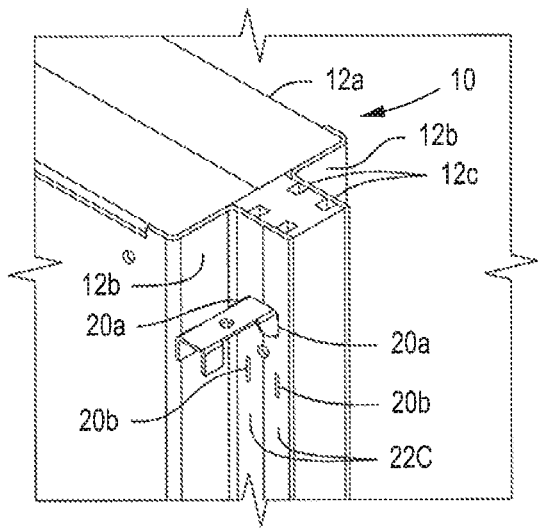
FIG. 6B shows a clip and a wall including a support panel with the clip partially inserted in slots in the support panel.
Figure 6C:
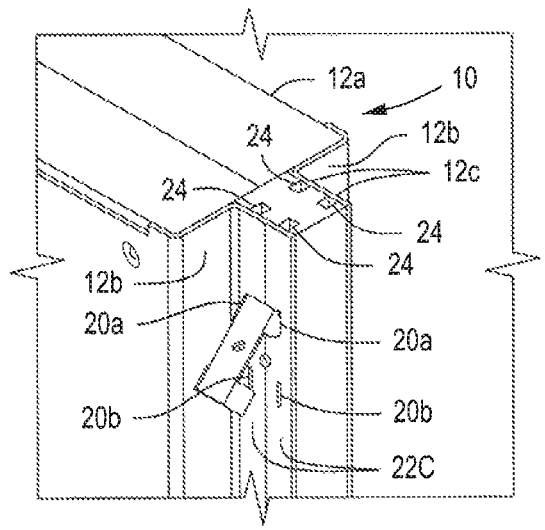
FIG. 6C shows a clip and a wall including a support panel with the partially rotated clip partially inserted in slots in the support panel.

In FIG. 6A, a clip 26 is depicted next to but separate from the support panel 12c including the wall surface and upper slots 20a, 21a, That clip 26 can be held in that position by a person (not shown) who is assembling the modular building structure shown therein such as a construction worker. When the upper prongs 30 are inserted tip-first into the slots in the manner shown in FIG. 6B, wherein the upper and lower plates of the clip 26 are perpendicular to the wall surface 12c, the upper portions of each of the upper prongs 30 will fit into the slots 20a, 21a, in the manner shown in FIG. 6B. Clip 26 is then rotated counterclockwise as shown in FIG. 6C, until it reaches its final position as seen in FIG. 2. The curved outer edges of each upper prong 30 provide for a smooth counterclockwise (viewed from the right side) rotation of the clip 26, as the opposed major surfaces of prongs 30 move through the slots 20a, 21a, and the inside corners (intersection between edges) each function as a fulcrum, such that the rotation also results in pulling of the clip towards the support panel that includes the wall surface 12c. As discussed above, the upper prongs also function as cams relative to the edges or the slots. Thus, the upper prongs 30 advantageously each operate as a lever and cam bringing the clip and support member together. In addition to the curved surface, the shape and relative dimensions of each upper prong 30 are beneficial as well. Each upper prong 30a, 30b, is elongated with the vertical distance across the prong greater than the horizontal distance across the prong. Vertical and horizontal in this context refer to the clip in its final installed position as shown in FIG. 2, in which the wall is also depicted in its vertical position. The shortest distance across the largest planar surface portions of upper prongs 30a, 30b, is measured from the outermost parts of the curved edges 32a, 32b, of each prong to the inside edges 34a, 34b, of the prongs 30a, 30b, where the inside corners are located. That distance is preferably slightly greater than the distance of the lengths of the upper slots. The greatest distance between the outer edges of upper prongs 30a, 30b is measured from the tips 36a, 36b to the base of the curved edges 32a, 32b. That distance is greater than the length of each upper slot 20a, 21a, measured from the upper ends to the lower ends of each slot 20a, 21b. Therefore the rotation of the clip and functioning or operation of the inside corners as fulcrums, and the outer edges 34a, 34b, as earns result in an interlocking of the clip with the support panel, particularly in conjunction with the insertion of the lower prongs into the lower slots, discussed elsewhere herein. Preferably, the greatest distance across the vertical dimension of the upper prong surface is over 2 times as long as the shortest distance of the upper prong surface.

Referring to FIG. 4, the first and second lower prongs 38a, 38b, each includes a ring-shaped member 40a, 40b, which can be integral with the lower (second) plate 45, which ring-shaped members define a space separating the top portions of each of the ring-shaped members 40a, 40b from the bottom portions of the ring-shaped members. The vertical distance of the space separating the top portion of the ring-shaped member from the bottom portion of the ring-shaped member is greater than the thickness of the circular (which can also be oval, elliptical or rectangular, or octagonal) ring portion of the ring-shaped member. The vertical distance across each lower prong 38a, 38b, should be only slightly greater than the vertical length of the corresponding slots 20a, 21a. When as described above the upper prongs 30a, 30b, are inserted into the upper slots 20a, 21a, and the clip 26 is rotated using the inside corners of the upper prongs as a fulcrum, the edges 34a, 34b, are inside the support member, and during rotation of the clip move on an arc toward the wall surface opposite (inside) the wall surface 12c, As edges 34a, 34b approach the inner surface (which cannot be seen in FIG. 2) of the of the support panel during counterclockwise rotation, the lower prongs 38a, 38b begin to enter the lower slots 20b, 21b of each support panel. As the lower prongs 38a, 38b slide into the slots 20b, 21b, the lower portion of the curved outer edges of the ring-shaped members 40a, 40b make contact with the lower edges of lower slots 20b, 21b, Due to the shapes and sizes of the apertures in each of the ring-shaped members 40a, 40b, as well as the gap between the upper plate 26 and the lower plate 45, there is sufficient vertical flex. (flexibility) in the lower prongs so that when pressure is exerted upward due to pushing the lower prong against the lower inside edges of lower slots 20b, 21b, the entire lower plate 45 shifts upward toward the upper plate 28 so that the lower plate 45 functions as a spring in a compressed state. As the counterclockwise rotation continues, the lower prong continues to penetrate the slot with the lower prong continuing to be in a compressed state. At some point during the rotation, the barbs 42a, 42b of the lower prongs reach the lower part of the lower slots 20b, 21b. Once the barbs pass through the slots, the two plates separate back from their compressed state and each lower prong "locks" into the corresponding lower slot, and the lower part of the clip is thus anchored. The first (upper) plate of the clip includes an aperture preferably positioned close to the center of the upper plate or between the center of the upper plate and the lower edge of the upper plate. The second (lower) plate includes a notch on its lower edge close to the center or middle between either of the outer edges. The aperture preferably in vertical alignment with the notch on the lower edge of the second plate, At least one purpose of that aperture and notch is so that a conventional tool such as needle-nosed pliers or internal snap-ring pliers can be used to manually pull the first (upper) plate and the second (lower) plate of the clip together. One nose of the pliars is inserted into the aperture and the other nose is inserted into the notch, and the pliars are squeezed together, so that the upper plate is moved toward the flexible lower plate; thus, the barbs 42a, 42b move upward and the vertical distances across the lower prongs 20b, 21b, become less than the length of the lower slots. As clip 26 is rotated clockwise (referring to FIG. 4) using the corner as a fulcrum, the lower prongs 38a, 38b can then be removed (backed out), Then as the clip continues to be rotated clockwise, the curved edges of the upper prongs slowly emerge out of the slot until the clip is perpendicular to the wall surface 12c of the support member, At that point, preferably, the upper prongs of the clip are pulled out (removed) and the clip is disengaged from the support member.

Figure 8B:
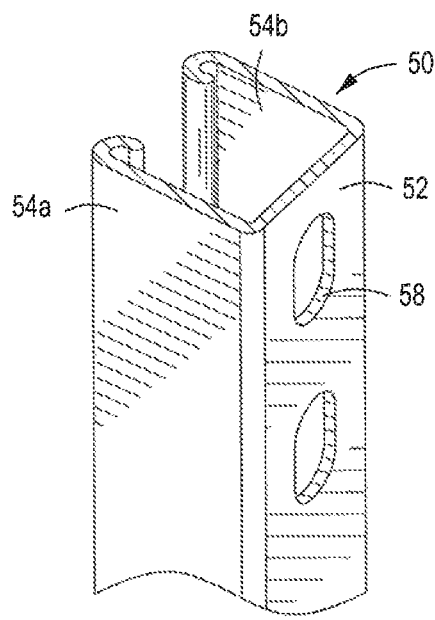
FIG. 8B is another perspective view of the strut channel in FIG. 6A.

FIGS. 8A and 8B show a specific embodiment of a strut channel also sometimes referred to as a "framing channel." A variety of strut or framing channels are commercially available including hut not limited to products sold under the trademark UNISTRUT® or, alternatively, products sold under the mark SUPERSTRUT™ as well as many others. Each of the side plates has an inwards-curving lip as seen in FIGS. 6A and 6B. The central plate of the strut channel is flat and has apertures running along the length of the strut channel.

FIG. 9 is a top view of a modular wall that includes two modular wall sections 10, 11 connected together. Modular wall section 10 in FIG. 9 is similar to modular wall section 10 in FIG. 2, except that wall section 10 in FIG. 9 includes channel struts 50, 50'; bolt 60 extending through both channel struts, both clips, wall panels 12c, 12c' and the core segment 22. Also, FIG. 9 shows the inner and outer wall portions of one wall section connected to the inner and outer wall portions of an adjoining wall section. As discussed elsewhere herein clips 26, 26' can be attached to the wall surfaces for panels 12c, 12c' by inserting the prongs of those clips into the slots of the outer wall surfaces which are part of each wall support element. The upper tips and part of the curved edge of prongs 30a, 30b can be seen in the FIG. 9 view from above. FIG. 9 also shows the longitudinal channels 24 that are part of the core segment 22. Those longitudinal channels are shaped and positioned to receive the upper and lower prongs of the clips. Bolt 60 extends through core segment 22, first extending through clip 26, then through core segment 22, and finally through clip 26' (not seen in FIG. 2).

One surprising benefit of the assembly shown in FIG. 9 is its impact on thermal conduction through the wall. In a preferred embodiment, bolt 60 is the only metal structure that runs from the inside of a room to the outside of the room. Certain specific embodiments of enclosures made from modular wall sections described elsewhere herein, e.g., FIG. 2, have total effective overall R-values in excess of 10 (hereinafter referred to as R-10), or even in excess of R-15 and preferably R-20 or more. In different specific embodiments, the R-values of enclosures are at least 10 (R-10), or at least R-11, or at least R-12, or at least R-13, or at least R-14, or at least R-15, in other specific embodiments, the overall R-value of the enclosure is within 25%-30% of the R-value of the individual wall section. For example, for a modular enclosure corresponding to FIGS. 2 and 9, assembled using 5 inch wall sections with insulation and inner cavity thickness of slightly more than 4¼ inches, an illustrative foam insulation may have 4-5 R per inch in which case the R value of the insulation is approximately 19. Surprisingly, however, the overall R-value of the assembled modular wall will be 15 or more, which is within 25%-30% of the R value of the insulation.

What is claimed as the invention is:

1. A modular enclosure for temperature-sensitive components, comprising:
   a modular wall section having a vertical support panel that is elongated, having a vertical side edge, an upper horizontal edge and a lower horizontal edge, wherein the vertical side edge is longer than either the upper or lower horizontal edges; and
   a vertical strut channel connected to the vertical support panel, the vertical strut channel comprising:
      a central plate that is adjacent the vertical support panel, the central plate having a width greater than a width of the vertical support panel; and
      two side plates configured to define an opening opposite the central plate that is fully or partially uncovered, each side plate including an inwardly-curving portion with a vertical edge pointed in the direction of the central plate and the vertical support panel and a horizontal upper edge that is curved and follows a continuously bending line without any angles;
   wherein the modular enclosure has an R-value of at least 10.

2. A modular enclosure for temperature-sensitive components, comprising:
   a first modular wall section having a first side panel and a first support panel, wherein the first support panel is elongated, having a vertical side edge, an upper horizontal edge and a lower horizontal edge, wherein the vertical side edge is longer than either the upper or lower horizontal edges;
   a second modular wall section having a second side panel and a second support panel coplanar with the first support panel, wherein the second support panel is elongated, having a vertical side edge, an upper horizontal edge and a lower horizontal edge, wherein the vertical side edge is longer than either the upper or lower horizontal edges; and
   a vertical strut channel comprising:
      a central plate that is adjacent the first support panel and the second support panel, the central plate having a width greater than a width of the first support panel, a width of the second support panel, or both; and
      two side plates configured to define an opening opposite the central plate that is fully or partially uncovered, each side plate including an inwardly-curving portion with a vertical edge pointed in the direction of the central plate, the first support panel, and the second support panel and a horizontal upper edge that is curved and follows a continuously bending line without any angles; wherein the first modular wall section and the second modular wall section are connected to form a vertical alcove between the first side panel and the second side panel; and the vertical strut channel is disposed in the vertical alcove.

3. A modular enclosure for temperature-sensitive components having an outer portion and an inner portion, comprising:
 a first inner wall, a first inner support panel, a second inner wall, a second inner support panel; a first outer wall, a first outer support panel, a second outer wall, a second outer support panel, and a core section, wherein:
 the first inner support panel and the first inner wall are unitary;
 the second inner support panel and the second inner wall are unitary;
 an inner connecting member connects the first inner support panel to the second inner support panel to form an inner alcove;
 the first outer support panel and the first outer wall are unitary;
 the second outer support panel and the second outer wall are unitary;
 an outer connecting member connects the first outer support panel to the second outer support panel to form an outer alcove;
 the core section is disposed between the first inner alcove and the second outer alcove;
 an inner strut channel is disposed within the inner alcove, the inner strut channel comprising:
  an inner central plate that is adjacent and parallel to the first inner support panel and the second inner support panel, the inner central plate having a width greater than a width of the first inner support panel, a width of the second inner support panel, or both; and
  two side plates configured to define an opening opposite the inner central plate that is fully or partially uncovered, each side plate including an inwardly-curving portion with a vertical edge pointed in the direction of the inner central plate, the first inner support panel, and the second inner support panel and a horizontal upper edge that is curved and follows a continuously bending line without any angles;
 an outer strut channel is disposed within the outer alcove, the outer strut channel comprising:
  an outer central plate that is adjacent and parallel to the first outer support panel and the second outer support panel, the outer central plate having a width greater than a width of the first outer support panel, a width of the second outer support panel, or both; and
  two side plates configured to define an opening opposite the outer central plate that is fully or partially uncovered, each side plate including an inwardly-curving portion with a vertical edge pointed in the direction of the outer central plate, the first outer support panel, and the second outer support panel and a horizontal upper edge that is curved and follows a continuously bending line without any angles; and
 a transverse member extending through the core section, the first inner support panel, the second inner support panel, the first outer support panel, the second outer support panel, the inner strut channel, and the outer strut channel.

4. The modular enclosure of claim 1 comprising a first modular wall section with a first vertical support panel; a second modular wall section with a second vertical support panel; an alcove between the first and second modular wall sections; and the vertical strut channel disposed in the alcove.

5. The modular enclosure of claim 2, wherein the first modular wall section includes a first support panel connected to the second modular wall section that includes a second support panel, and wherein: the first support panel includes a first ledge; the second support panel includes a second ledge; and the vertical strut channel is connected to the first ledge and the second ledge.

6. The modular enclosure of claim 1 comprising: a first modular wall section that includes a first vertical support panel, a second modular wall section that includes a second vertical support panel and the vertical strut channel disposed between portions of the first and second modular wall sections.

7. The modular enclosure of claim 1, comprising:
 a first modular wall section that comprises a first vertical support panel;
 a second modular wall section that comprises a second vertical support panel;
 the vertical strut channel;
 wherein the first vertical support panel and the second vertical support panel are connected to form an alcove between the first and second vertical support panels; and
 a portion of the vertical strut channel is disposed against the first vertical support panel and a portion of the vertical strut channel is disposed against the second vertical support channel.

8. The modular enclosure of claim 2 additionally comprising a metallic member extending between the first modular wall section and the second modular wall section, wherein the metallic member holds the first and second modular wall sections together.

9. The modular enclosure of claim 2 additionally comprising a clip holding the first modular wall section and the second modular wall section together.

10. The modular enclosure of claim 2 wherein the first modular wall section has one or more first vertical slots; the second modular wall section has one or more second vertical slots; the modular enclosure further includes one or more clips with prongs disposed into the first and second vertical slots; and the modular enclosure further includes an elongated metallic member having a U-shaped profile viewed from either end of the elongated metallic member with two facing elongated side portions and an elongated central portion between and connecting the two facing side portions, wherein the elongated central portion has aperture and the elongated metallic member is disposed against the one or more clips.

11. The modular enclosure of claim 1, further comprising a component attached to the vertical strut channel, wherein the temperature-sensitive component is selected from the group consisting of: SCADA systems, RTU's, control panels, flow computers, gas chromatographs, storage batteries, computers and servers, radio transmitters and receivers, generators, compressors, and pumps.

12. A modular enclosure for temperature-sensitive components, comprising:
 two modular walls, each modular wall of the two modular walls having a support panel and side panel, wherein the support panel is elongated, having a vertical side edge, an upper horizontal edge and a lower horizontal edge, wherein the vertical side edge is longer than either the upper or lower horizontal edges;

a clip connected to each support panel of the two modular walls; and a vertical strut channel comprising:

a central plate connected to the clip, the central plate having a width greater than a width of the support panel; and two side plates configured to define an opening opposite the central plate that is fully or partially uncovered, each side plate including an inwardly-curving portion with a vertical edge pointed in the direction of the central plate and the support panels of the two modular walls and a horizontal upper edge that is curved and follows a continuously bending line without any angles.

13. The modular enclosure of claim 12, wherein the clip is disposed between the two modular walls.

14. The modular enclosure of claim 12, wherein the clip is disposed between the support panels and the vertical strut channel.

15. The modular enclosure of claim 12, wherein the support panels are parallel to each other and also parallel to the central plate of the vertical strut channel that is connected to the clip.

16. The modular enclosure of claim 12, wherein each support panel and the central plate of the vertical strut channel face outward.

17. The modular enclosure of claim 12, further comprising a metallic member extending through the central plate of the vertical strut channel, the clip, and each support panel.

18. The modular enclosure of claim 12, wherein the central plate and the two side plates of the vertical strut channel are unitary.

19. A modular enclosure for temperature-sensitive components, comprising:

a first modular wall comprising:
a first central panel;
a first side panel perpendicular to the first central panel; and
a first support panel, wherein the first support panel is elongated, having a vertical side edge, an upper horizontal edge and a lower horizontal edge, wherein the vertical side edge is longer than either the upper or lower horizontal edges;

a second modular wall comprising:
a second central panel;
a second side panel perpendicular to the second central panel; and
a second support panel, wherein the second support panel is coplanar with the first support panel; and the second support panel is elongated, having a vertical side edge, an upper horizontal edge and a lower horizontal edge, wherein the vertical side edge is longer than either the upper or lower horizontal edges;

a vertical strut channel disposed between the first side panel and the second side panel, the vertical strut channel comprising:
a central plate that is adjacent the first support panel and the second support panel, the central plate having a width greater than a width of the first support panel, a width of the second support panel, or both; and
two side plates configured to define an opening opposite the central plate that is fully or partially uncovered, each side plate including an inwardly-curving portion with a vertical edge pointed in the direction of the central plate, and the first support panel, and the second support panel and a horizontal upper edge that is curved and follows a continuously bending line without any angles.

20. The modular enclosure of claim 19, wherein the central plate of the vertical strut channel is parallel to the first support panel and the second support panel.

21. The modular enclosure of claim 19, further comprising a clip disposed between the side panels and the central plate of the vertical strut channel.

22. The modular enclosure of claim 19, wherein the first side panel and the second side panel are parallel to the two side plates of the vertical strut channel.

23. The modular enclosure of claim 19, wherein the first side panel and the second side panel are perpendicular to the first support panel and the second support panel.

24. The modular enclosure of claim 19, wherein the two side plates of the vertical strut channel are perpendicular to the first support panel and the second support panel.

25. The modular enclosure of claim 19, wherein the central plate and two side plates of the vertical strut channel are unitary.

* * * * *